United States Patent
Sugiyama et al.

(10) Patent No.: US 12,046,668 B2
(45) Date of Patent: Jul. 23, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toru Sugiyama, Musashino Tokyo (JP); Akira Yoshioka, Yokohama Kanagawa (JP); Hitoshi Kobayashi, Yamato Kanagawa (JP); Masaaki Onomura, Setagaya Tokyo (JP); Yasuhiro Isobe, Ota Tokyo (JP); Hung Hung, Kawasaki Kanagawa (JP); Hideki Sekiguchi, Yokohama Kanagawa (JP); Tetsuya Ohno, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 137 days.

(21) Appl. No.: 17/942,605

(22) Filed: Sep. 12, 2022

(65) Prior Publication Data

US 2023/0290871 A1    Sep. 14, 2023

(30) Foreign Application Priority Data

Mar. 9, 2022   (JP) ................................ 2022-036260

(51) Int. Cl.
*H01L 29/778* (2006.01)
*G01R 19/00* (2006.01)
(Continued)

(52) U.S. Cl.
CPC ...... *H01L 29/7786* (2013.01); *G01R 19/0092* (2013.01); *H01L 29/2003* (2013.01); *H01L 29/205* (2013.01); *H01L 29/41758* (2013.01)

(58) Field of Classification Search
CPC .............. H01L 29/2003; H01L 29/205; H01L 29/41758; H01L 29/7786; G01R 19/0092
See application file for complete search history.

(56) References Cited

U.S. PATENT DOCUMENTS

| | | | |
|---|---|---|---|
| 7,288,803 | B2 | 10/2007 | Beach et al. |
| 9,406,668 | B2 | 8/2016 | Nagai et al. |

(Continued)

FOREIGN PATENT DOCUMENTS

| | | |
|---|---|---|
| JP | 2006-108679 A | 4/2006 |
| JP | 5497985 B2 | 5/2014 |
| WO | 2014155959 A1 | 10/2014 |

*Primary Examiner* — Reena Aurora
(74) *Attorney, Agent, or Firm* — Kim & Stewart LLP

(57) ABSTRACT

A semiconductor device includes: a drain electrode including a plurality of drain finger parts; a source electrode including a plurality of source finger parts and a Kelvin source part electrically connected with the source finger parts; a sense electrode positioned between a drain finger part and the Kelvin source part, which are next to each other in a particular direction; and a gate electrode positioned between a drain finger part and a source finger part, which are next to each other in the particular direction, and between a drain finger part and the sense electrode, which are next to each other in the particular direction. The sense electrode and the Kelvin source part are electrically connected via a sense resistance due to a spacing between the sense electrode and the Kelvin source part in the particular direction.

12 Claims, 5 Drawing Sheets

(51) Int. Cl.
 H01L 29/20  (2006.01)
 H01L 29/205 (2006.01)
 H01L 29/417 (2006.01)

(56) References Cited

U.S. PATENT DOCUMENTS

| | | | |
|---|---|---|---|
| 10,771,057 B1 * | 9/2020 | Yoshioka | H01L 24/49 |
| 2006/0131760 A1 | 6/2006 | Standing et al. | |
| 2014/0326901 A1 * | 11/2014 | Colvin | H01J 37/3171 |
| | | | 118/723 R |
| 2022/0084916 A1 * | 3/2022 | Sugiyama | H01L 28/20 |

* cited by examiner

SEMICONDUCTOR DEVICE

CROSS-REFERENCE TO RELATED APPLICATION

This application is based upon and claims the benefit of priority from Japanese Patent Application No. 2022-036260, filed on Mar. 9, 2022, the entire contents of which are incorporated herein by reference.

FIELD

Embodiments described herein relate generally to a semiconductor device.

BACKGROUND

Currently, GaN power devices that include functions such as overcurrent protection and the like are limited to cascode types that use silicon MOSFETs (Metal-Oxide-Semiconductor Field Effect Transistors) to monitor the current. It is desirable to monitor the current of a single normally-off GaN device by making a current-sense element in the GaN device.

DETAILED DESCRIPTION

Figure 1:
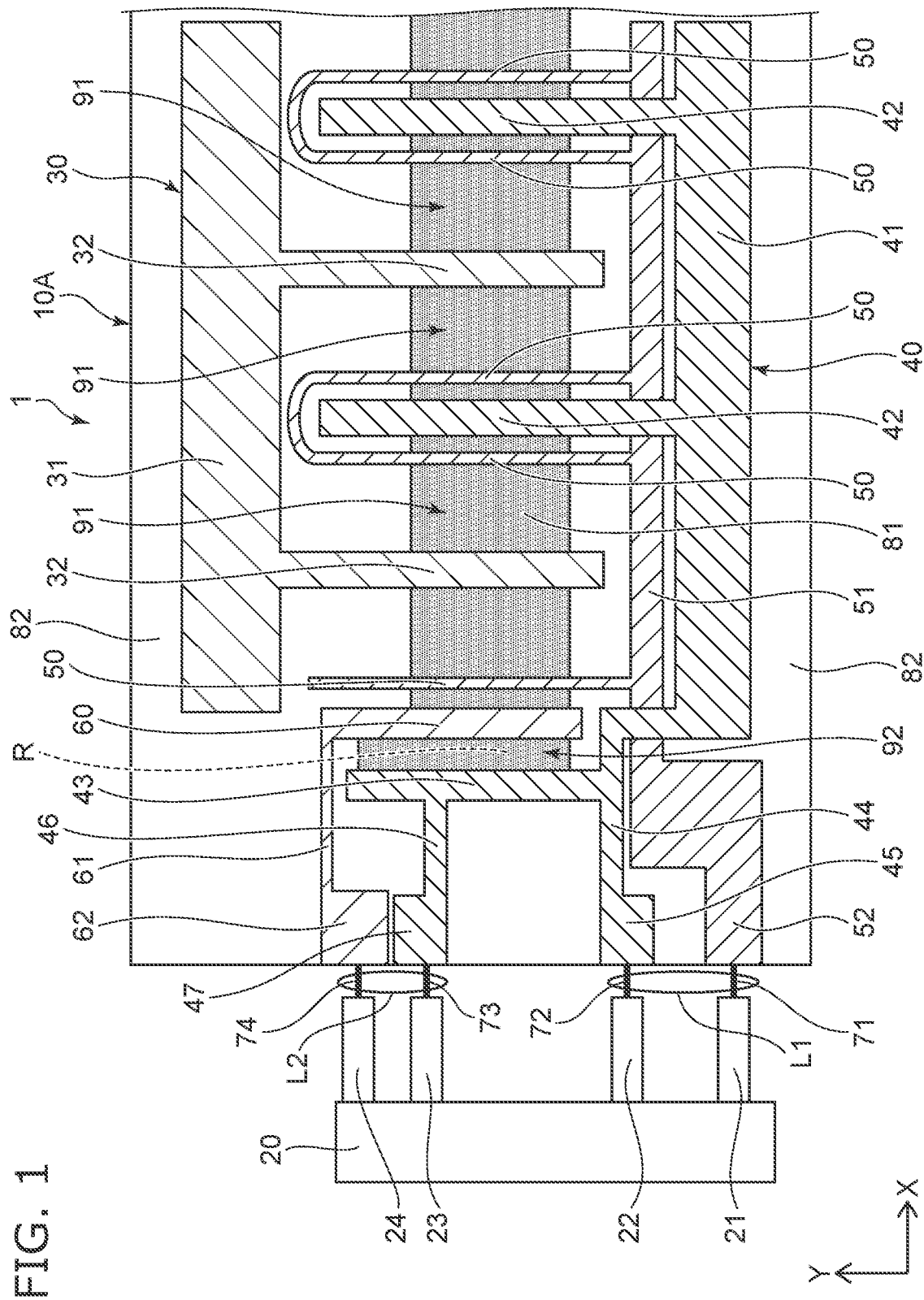
FIG. 1 is a schematic view showing an example of a planar layout of a semiconductor device of an embodiment.

According to one embodiment, a semiconductor device includes a first nitride semiconductor layer; a second nitride semiconductor layer located on the first nitride semiconductor layer, the second nitride semiconductor layer having a wider bandgap than the first nitride semiconductor layer; a drain electrode including a plurality of drain finger parts, the plurality of drain finger parts extending in a first direction; a source electrode including a plurality of source finger parts extending in the first direction, and a Kelvin source part extending in the first direction, the Kelvin source part being electrically connected with the source finger parts; a sense electrode positioned between the drain finger part and the Kelvin source part next to each other in a second direction crossing the first direction, the sense electrode extending in the first direction; and a gate electrode positioned between the drain finger part and the source finger part next to each other in the second direction and between the drain finger part and the sense electrode next to each other in the second direction, the gate electrode extending in the first direction. The sense electrode and the Kelvin source part are electrically connected via a sense resistance due to a spacing between the sense electrode and the Kelvin source part in the second direction.

Embodiments will now be described with reference to the drawings. The same components in the drawings are marked with the same reference numerals.

As shown in FIG. 1, a semiconductor device 1 of an embodiment includes a first chip 10A and a second chip 20. For example, the first chip 10A and the second chip 20 are included in one package mounted on a wiring substrate, or the first chip 10A and the second chip 20 may be included in separate packages mounted on the wiring substrate.

Figure 2:
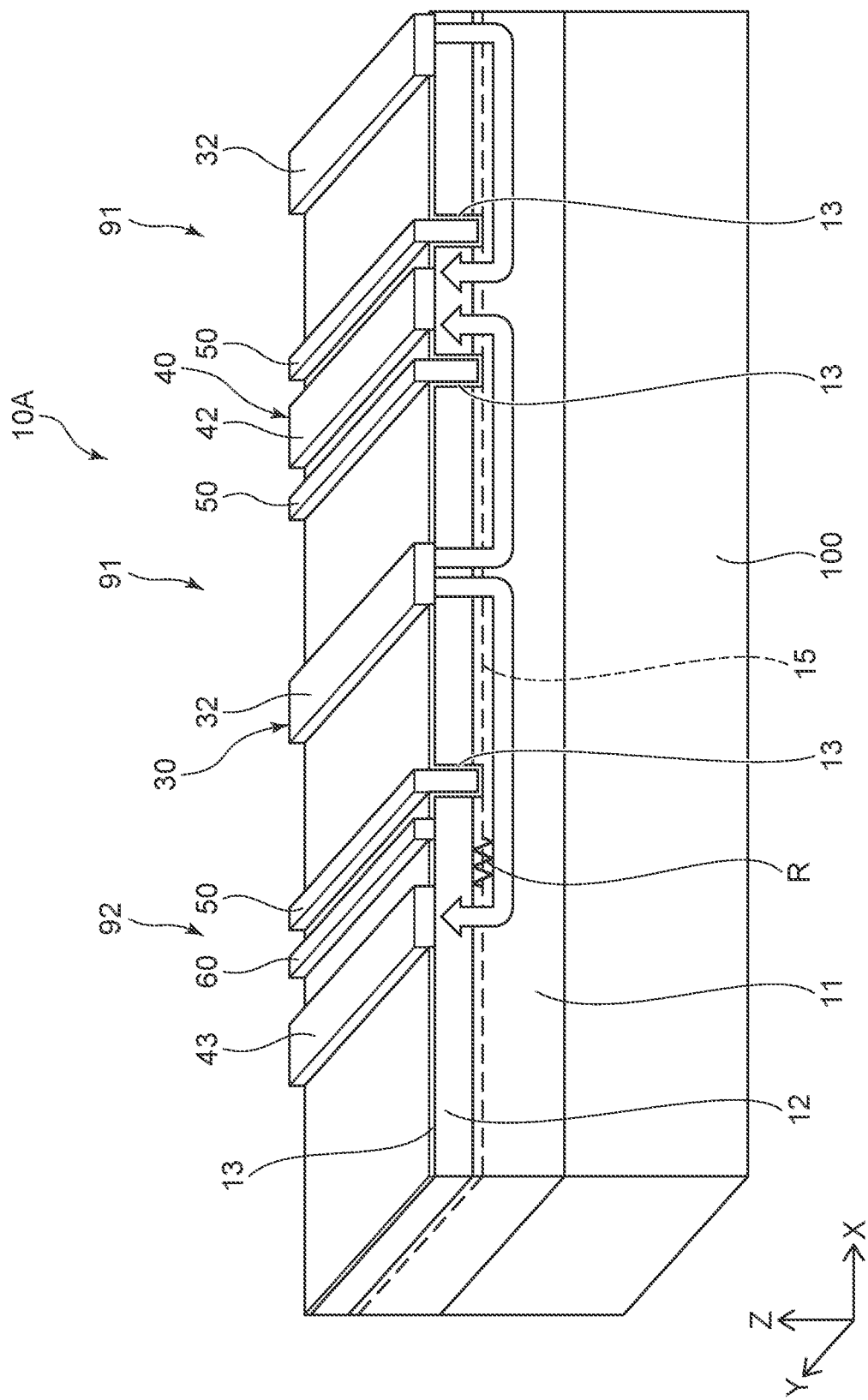
FIG. 2 is a schematic cross-sectional perspective view of a first chip of the semiconductor device of the embodiment.
Figure 3:
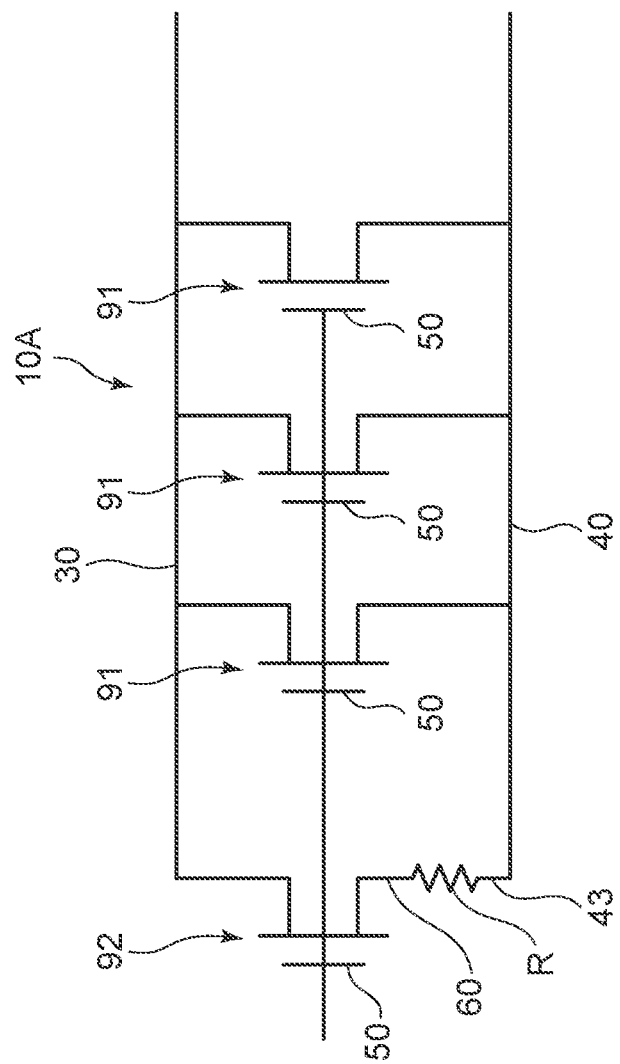
FIG. 3 is an equivalent circuit diagram of the first chip shown in FIG. 2.

The first chip 10A is, for example, a normally-off nitride semiconductor HEMT (High Electron Mobility Transistor) that is off when the gate has no input signal. For example, as shown in FIG. 2, the first chip 10A has MOS structures where portions of a second nitride semiconductor layer 12 are removed. An insulating film 13 is located between a gate electrode 50 and the second nitride semiconductor layer 12 and between the gate electrode 50 and a first nitride semiconductor layer 11, or the first chip 10A may have a structure in which a p-type nitride semiconductor layer is included below the gate electrode.

As shown in FIG. 2, the first chip 10A includes the first nitride semiconductor layer 11 and the second nitride semiconductor layer 12. The first nitride semiconductor layer 11 is located on a substrate 100; and the second nitride semiconductor layer 12 is located on the first nitride semiconductor layer 11. The first nitride semiconductor layer 11 and the second nitride semiconductor layer 12 have a heterojunction. The first nitride semiconductor layer 11 may be located on the substrate 100 with a buffer layer interposed.

The bandgap of the second nitride semiconductor layer 12 is wider than the bandgap of the first nitride semiconductor layer 11. For example, the first nitride semiconductor layer 11 is a GaN layer; and the second nitride semiconductor layer 12 is an AlGaN layer. A two-dimensional electron gas 15 is distributed in the first nitride semiconductor layer 11 at the vicinity of the interface with the second nitride semiconductor layer 12. The insulating film 13 is located on the second nitride semiconductor layer 12. For example, a silicon oxide film or a silicon nitride film can be used as the insulating film 13.

The first chip 10A includes a drain electrode 30, a source electrode 40, multiple gate electrodes 50, and a sense electrode 60. The drain electrode 30, the source electrode 40, the gate electrode 50, and the sense electrode 60 are located on the second nitride semiconductor layer 12.

In FIGS. 1 and 2, two directions that are orthogonal to each other are taken as a first direction Y and a second direction X. In FIG. 2, a direction that is orthogonal to the first and second directions Y and X and is from the first nitride semiconductor layer 11 toward the second nitride semiconductor layer 12 is taken as a third direction Z.

As shown in FIG. 1, the drain electrode 30 includes a drain power supply part 31 extending in the second direction X, and multiple drain finger parts 32 extending in the first direction Y from the drain power supply part 31. As shown in FIG. 2, the drain finger parts 32 contact the second nitride semiconductor layer 12.

As shown in FIG. 1, the source electrode 40 includes a source power supply part 41 extending in the second direction X, multiple source finger parts 42 extending in the first direction Y from the source power supply part 41, and a Kelvin source part 43 extending in the first direction Y from the source power supply part 41. The source finger parts 42 and the Kelvin source part 43 are electrically connected to each other via the source power supply part 41. As shown in FIG. 2, the source finger parts 42 and the Kelvin source part 43 contact the second nitride semiconductor layer 12.

The sense electrode 60 extends in the first direction Y and is positioned between the drain finger part 32 and the Kelvin source part 43 that are next to each other in the second direction X. The sense electrode 60 contacts the second nitride semiconductor layer 12.

The gate electrode 50 extends in the first direction Y and is positioned between the drain finger part 32 and the source finger part 42 that are next to each other in the second direction X and between the drain finger part 32 and the sense electrode 60 that are next to each other in the second direction X. The gate electrode 50 is positioned on the insulating film 13 and does not contact the second nitride semiconductor layer 12. However, the gate electrode 50 contacts the p-type nitride semiconductor layer in a structure in which the p-type nitride semiconductor layer is included under the gate electrode 50.

The first chip 10A includes multiple main elements 91 and at least one sense element 92. The substrate 100, the first nitride semiconductor layer 11, the second nitride semiconductor layer 12, the insulating film 13, and the two-dimensional electron gas 15 are common to the main elements 91 and the sense element 92.

The main element 91 includes the drain finger part 32 and the source finger part 42 that are next to each other in the second direction X. The main element 91 also includes the gate electrode 50 positioned between the drain finger part 32 and the source finger part 42 that are next to each other in the second direction X.

The sense element 92 includes the sense electrode 60, the drain finger part 32 that is next to the sense electrode 60 in the second direction X, the gate electrode 50 that is positioned between the drain finger part 32 and the sense electrode 60, and the Kelvin source part 43. The sense electrode 60 is positioned between the Kelvin source part 43 and the gate electrode 50 in the second direction X. The sense element 92 further includes a sense resistance R due to the spacing between the sense electrode 60 and the Kelvin source part 43 in the second direction X. The sense resistance R includes the two-dimensional electron gas 15 distributed under the region between the Kelvin source part 43 and the sense electrode 60. The sense electrode 60 and the Kelvin source part 43 are electrically connected via the sense resistance R that includes the two-dimensional electron gas 15.

In FIG. 1, a distribution region 81 of the two-dimensional electron gas 15 is shown as a cross-hatched region. The distribution region 81 of the two-dimensional electron gas 15 is surrounded with an element separation region 82.

The second chip 20 is a gate driver that controls the operation of the first chip 10A. The second chip 20 includes a first terminal 21, a second terminal 24, a first ground terminal 22, and a second ground terminal 23. The first terminal 21 and the second terminal 24 are separated in the first direction Y. The first ground terminal 22 is positioned between the first terminal 21 and the second ground terminal 23 in the first direction Y. The second ground terminal 23 is positioned between the first ground terminal 22 and the second terminal 24 in the first direction Y.

The first chip 10A includes a gate terminal 52, a sense terminal 62, a first Kelvin source terminal 45, and a second Kelvin source terminal 47.

The gate terminal 52 is electrically connected with the gate electrode 50 via gate wiring 51 inside the first chip 10A. Also, the gate terminal 52 is electrically connected with the first terminal 21 of the second chip 20 via wiring 71.

The sense terminal 62 is electrically connected with the sense electrode 60 via wiring 61 inside the first chip 10A. Also, the sense terminal 62 is electrically connected with the second terminal 24 of the second chip 20 via wiring 74.

The first Kelvin source terminal 45 is positioned between the gate terminal 52 and the sense terminal 62 in the first direction Y. The first Kelvin source terminal 45 is electrically connected with the source power supply part 41 via wiring 44 inside the first chip 10A. Also, the first Kelvin source terminal 45 is electrically connected with the first ground terminal 22 of the second chip 20 via wiring 72.

The second Kelvin source terminal 47 is positioned between the first Kelvin source terminal 45 and the sense terminal 62 in the first direction Y. The second Kelvin source terminal 47 is electrically connected with the Kelvin source part 43 via wiring 46 inside the first chip 10A. The Kelvin source part 43 is connected to the wiring 44 that connects the first Kelvin source terminal 45 and the source power supply part 41. The second Kelvin source terminal 47 is electrically connected with the second ground terminal 23 of the second chip 20 via wiring 73.

A gate control signal from the first terminal 21 of the second chip 20 is applied to the gate terminal 52 of the first chip 10A. A ground potential is applied to the first Kelvin source terminal 45 of the first chip 10A via the first ground terminal 22 of the second chip 20. A ground potential is applied to the second Kelvin source terminal 47 of the first chip 10A via the second ground terminal 23 of the second chip 20. For example, the voltage between the source electrode 40 and the gate electrode 50 is switched in a range of 0 V to ten and several V. By controlling the potential of the gate electrode 50, the current (the main current) that flows between the drain finger part 32 and the source finger part 42 of the main element 91 can be switched on and off.

The current (the sense current) that flows through the sense resistance R can be monitored based on the voltage between the sense electrode 60 and the Kelvin source part 43 of the sense element 92. Overcurrent and the like of the main element 91 can be detected based on the sense current.

The sense element 92 of the embodiment can be formed easily and inexpensively by setting a portion of the fingers to be the sense electrode 60 in a process of forming electrodes having a multi-finger structure. The sense electrode 60 can be formed right next to the Kelvin source part 43, which does not increase the surface area of the sense element 92, and can reduce parasitic components (the resistance, the inductance, etc.).

The current sense accuracy can be increased particularly at high temperatures because the sense resistance R is formed of the two-dimensional electron gas 15 that has the same temperature characteristics as the on-resistance of the main element 91.

The sense resistance R is represented by $\rho \times Lr/Wr$. $\rho$ is the sheet resistance of the two-dimensional electron gas 15. Lr is the spacing in the second direction X between the Kelvin source part 43 and the sense electrode 60. Wr is the width of the first direction Y of the distribution region of the two-dimensional electron gas 15 distributed under the region between the Kelvin source part 43 and the sense electrode 60. The resistance value of the sense resistance R can be adjusted using Lr and Wr.

The resistance value of the sense element 92 that includes the sense resistance R is less than the resistance value of one main element 91. In order for the current to easily flow uniformly in the first chip 10A, it is necessary to sufficiently reduce the resistance value of the sense resistance R compared to the resistance value of the main element 91 in a range in which the generated voltage can be monitored. For example, it is favorable for the resistance value of the sense resistance R to be not more than 1/10 of the resistance value of the main element 91.

To reduce the resistance value of the sense resistance R, it is favorable for a spacing Lr in the second direction X between the Kelvin source part 43 and the sense electrode 60 to be less than the spacing in the second direction X between the drain finger part 32 and the source finger part 42 of the main element 91.

In order to reduce the resistance value of the sense resistance R, it is favorable for a width Wr in the first direction Y of the distribution region of the two-dimensional electron gas 15 distributed under the region between the Kelvin source part 43 and the sense electrode 60 to be greater than the width in the first direction Y of the distribution region of the two-dimensional electron gas 15 between the drain finger part 32 and the source finger part 42 of the main element 91.

As shown in FIG. 1, the first Kelvin source terminal 45 that forms a gate control loop L1 with the gate terminal 52 is located between the gate terminal 52 and the sense terminal 62 in the first direction Y; and the second Kelvin source terminal 47 that forms a sense current monitor loop L2 with the sense terminal 62 is located between the first Kelvin source terminal 45 and the sense terminal 62. Thereby, micro sense voltages can be shielded from the gate control signal; and the monitor control of the sense current can be improved.

Figure 4:
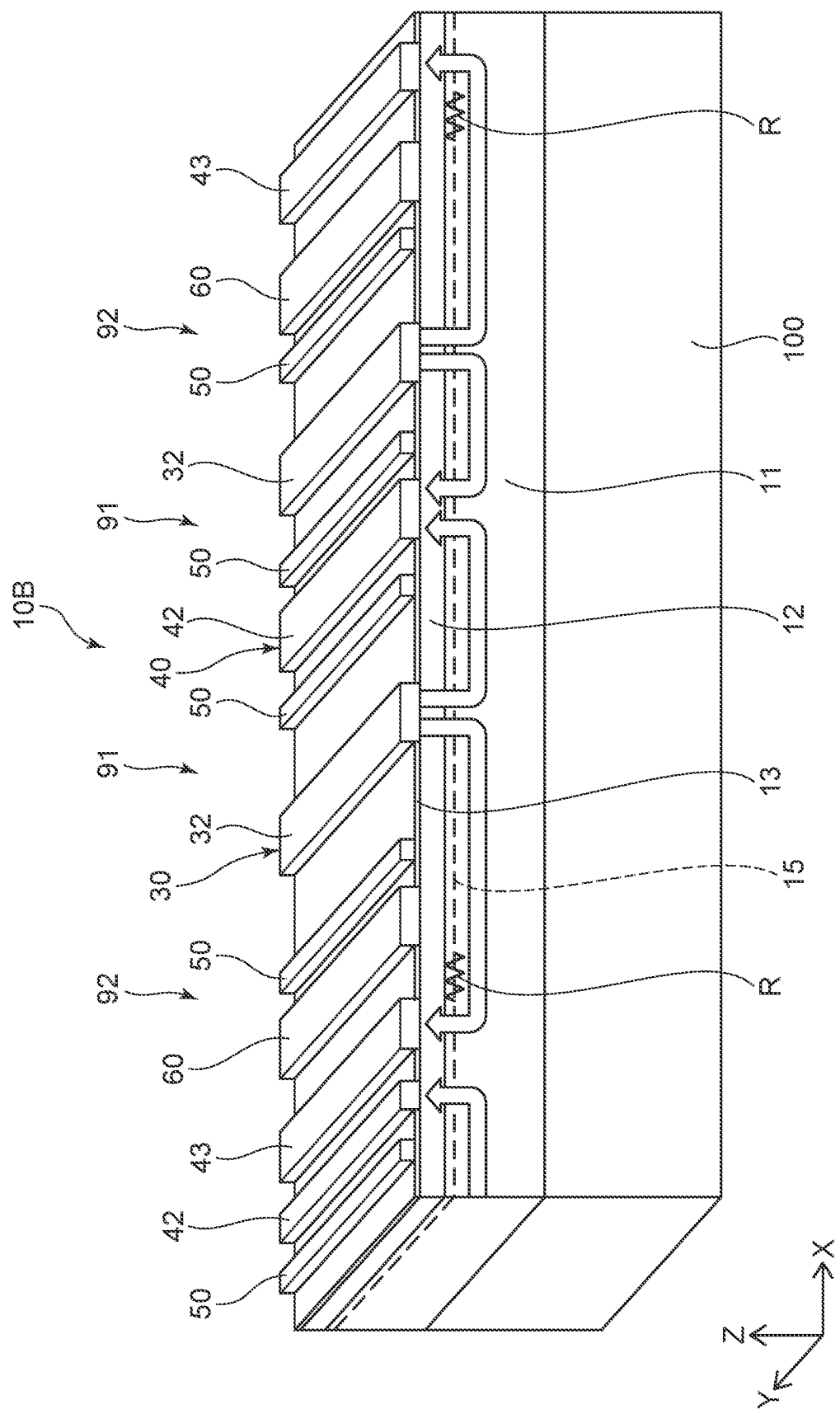
FIG. 4 is a schematic cross-sectional perspective view showing another example of the first chip of the embodiment.
Figure 5:
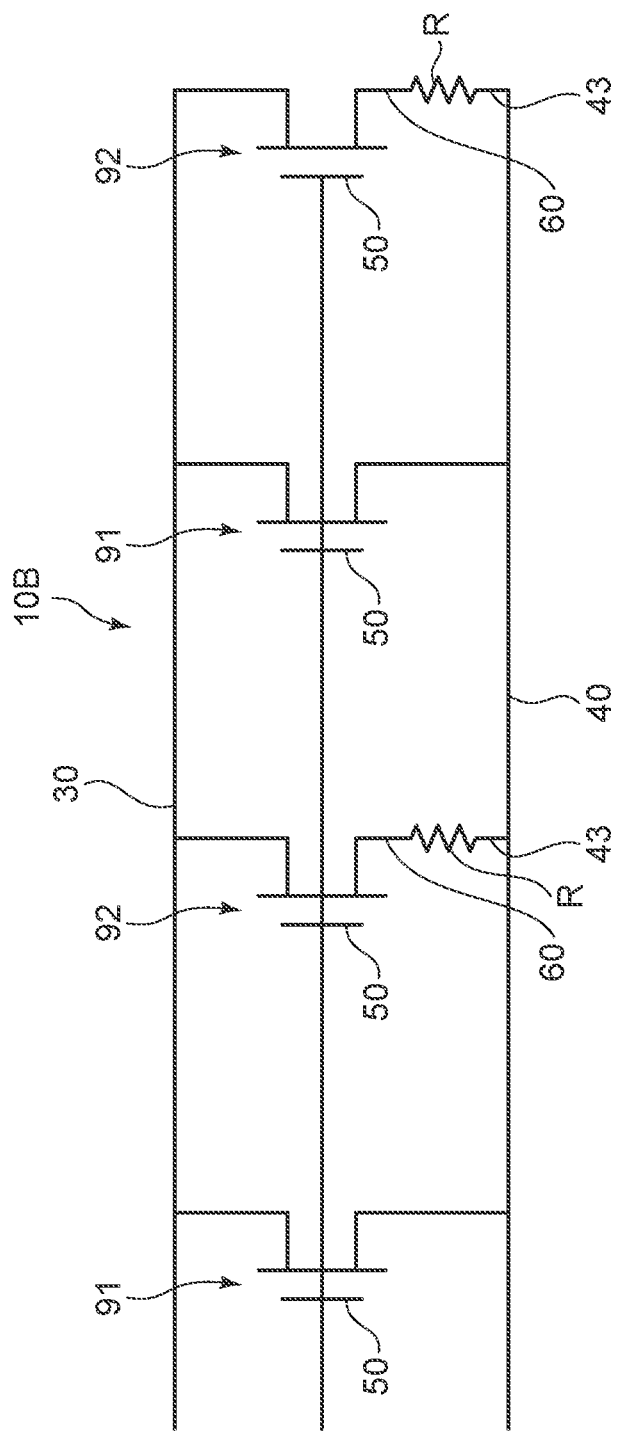
FIG. 5 is an equivalent circuit diagram of the first chip shown in FIG. 4.

For example, one sense element 92 is located in the peripheral region of the region in which the multiple main elements 91 are located (the peripheral region of the chip). Multiple sense elements 92 are included in a first chip 10B shown in FIGS. 4 and 5. In other words, the first chip 10B includes multiple Kelvin source parts 43 and multiple sense electrodes 60. The sense element 92 is located in the peripheral region of the region in which the multiple main elements 91 are located as well as in regions between the main element 91 and the main element 91. The current distribution between the peripheral region and the region inside the peripheral region in the first chip 10B can be monitored thereby.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
    a first nitride semiconductor layer;
    a second nitride semiconductor layer located on the first nitride semiconductor layer, the second nitride semiconductor layer having a wider bandgap than the first nitride semiconductor layer;
    a drain electrode including a plurality of drain finger parts, the plurality of drain finger parts extending in a first direction;
    a source electrode including
        a plurality of source finger parts extending in the first direction, and
        a Kelvin source part extending in the first direction, the Kelvin source part being electrically connected with the source finger parts;
    a sense electrode positioned between the drain finger part and the Kelvin source part next to each other in a second direction crossing the first direction, the sense electrode extending in the first direction; and
    a gate electrode positioned between the drain finger part and the source finger part next to each other in the second direction and between the drain finger part and the sense electrode next to each other in the second direction, the gate electrode extending in the first direction,
    the sense electrode and the Kelvin source part being electrically connected via a sense resistance due to a spacing between the sense electrode and the Kelvin source part in the second direction.

2. The semiconductor device according to claim 1, wherein
    the spacing in the second direction between the Kelvin source part and the sense electrode is less than a spacing in the second direction between the drain finger part and the source finger part.

3. The semiconductor device according to claim 1, wherein
    the sense resistance includes a two-dimensional electron gas distributed in the first nitride semiconductor layer at a vicinity of an interface with the second nitride semiconductor layer.

4. The semiconductor device according to claim 3, wherein
    a width in the first direction of a distribution region of the two-dimensional electron gas in the sense resistance is greater than a width in the first direction of a distribution region of the two-dimensional electron gas between the drain finger part and the source finger part.

5. The semiconductor device according to claim 1, further comprising:
    an insulating film located on the second nitride semiconductor layer,
    the drain finger part, the source finger part, the Kelvin source part, and the sense electrode contacting the second nitride semiconductor layer,
    the gate electrode being positioned on the insulating film.

6. The semiconductor device according to claim 1, further comprising:
    a gate terminal connected with the gate electrode;
    a sense terminal connected with the sense electrode;
    a first Kelvin source terminal positioned between the gate terminal and the sense terminal in the first direction and connected to the source electrode and a first ground terminal of a gate driver; and
    a second Kelvin source terminal positioned between the first Kelvin source terminal and the sense terminal in the first direction and connected to the source electrode and a second ground terminal of the gate driver.

7. The semiconductor device according to claim 1, wherein
    a plurality of the Kelvin source parts and a plurality of the sense electrodes are included.

8. The semiconductor device according to claim 1, wherein
    the first nitride semiconductor layer is a GaN layer, and
    the second nitride semiconductor layer is an AlGaN layer.

9. The semiconductor device according to claim 1, wherein
    a resistance value of the sense resistance is less than a resistance value of one main element, and
    the main element includes:
        the drain finger part,
        the source finger part, and the gate electrode positioned between the drain finger part and the source finger part.

10. The semiconductor device according to claim 9, wherein
the resistance value of the sense resistance is not more than $1/10$ of the resistance value of the main element.

11. The semiconductor device according to claim 9, wherein
a plurality of the main elements is included,
a sense element includes the sense resistance, and
the sense element is located in a region at a periphery of a region in which the plurality of main elements is located.

12. The semiconductor device according to claim 1, wherein
the semiconductor device is a normally-off nitride semiconductor device that is off when the gate electrode has no input signal.

* * * * *